US012779511B2

(12) United States Patent
D'Elia et al.

(10) Patent No.: US 12,779,511 B2
(45) Date of Patent: Nov. 3, 2026

(54) METHOD FOR PROCESSING SUBSTRATE

(71) Applicant: Tokyo Electron Limited, Tokyo (JP)

(72) Inventors: Peter D'Elia, Albany, NY (US); Ronald Nasman, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 42 days.

(21) Appl. No.: 18/900,130

(22) Filed: Sep. 27, 2024

(65) Prior Publication Data

US 2026/0091417 A1 Apr. 2, 2026

(51) Int. Cl.

| | |
|---|---|
| ***B08B 7/04*** | (2006.01) |
| ***B08B 3/08*** | (2006.01) |
| ***B08B 3/14*** | (2006.01) |
| ***B08B 7/00*** | (2006.01) |
| ***H10P 70/00*** | (2026.01) |

(52) U.S. Cl.

CPC .................. *B08B 7/04* (2013.01); *B08B 3/08* (2013.01); *B08B 3/14* (2013.01); *B08B 7/0021* (2013.01); *H10P 70/20* (2026.01)

(58) Field of Classification Search

CPC ......... B08B 7/0021; H10P 70/20; H10P 70/80

See application file for complete search history.

(56) References Cited

U.S. PATENT DOCUMENTS

| | | | |
|---|---|---|---|
| 6,562,146 | B1 | 5/2003 | DeYoung |
| 6,576,066 | B1 | 6/2003 | Namatsu |
| 6,703,316 | B2 | 3/2004 | Inoue |
| 6,841,031 | B2 | 1/2005 | Iwata |
| 6,874,513 | B2 | 4/2005 | Yamagata |
| 7,252,719 | B2 | 8/2007 | Sakashita |
| 9,679,788 | B2 | 6/2017 | Jung |
| 9,922,848 | B2 | 3/2018 | Miya |
| 11,688,613 | B2 | 6/2023 | Umezaki |
| 2007/0022949 | A1 | 2/2007 | Saito |
| 2013/0269732 | A1 | 10/2013 | Banerjee et al. |
| 2017/0092484 | A1 | 3/2017 | Brown |
| 2017/0098541 | A1 | 4/2017 | Gouk et al. |
| 2019/0287823 | A1 | 9/2019 | Verhaverbeke et al. |
| 2022/0326617 | A1 | 10/2022 | Park |
| 2023/0265362 | A1 | 8/2023 | Wada |
| 2023/0341779 | A1 | 10/2023 | Choi |
| 2023/0405642 | A1 | 12/2023 | Hu |
| 2024/0213043 | A1 | 6/2024 | Lim |

FOREIGN PATENT DOCUMENTS

| | | |
|---|---|---|
| KR | 20190138267 A | 12/2019 |
| KR | 20240102706 A | 7/2024 |

OTHER PUBLICATIONS

International Searching Authority, "Notification of Transmittal of the International Search Report and the Written Opinion of the International Searching Authority, or the Declaration," International application No. PCT/US2025/033326, Date of mailing Oct. 13, 2025, 13 pages.

Quinn, E., "The Surface Tension of Liquid Carbon Dioxide," Journal of the American Chemical Society, vol. 49/Issue 11, Nov. 5, 1927, 8 pages.

*Primary Examiner* — Natasha N Campbell

(74) *Attorney, Agent, or Firm* — Slater Matsil, LLP

(57) ABSTRACT

A method for processing a substrate includes providing the substrate into a processing chamber, adding a processing fluid into the processing chamber, adding a dry fluid to the processing chamber while draining the processing fluid from the processing chamber, and releasing the dry fluid from the processing chamber in a gaseous phase.

20 Claims, 12 Drawing Sheets

METHOD FOR PROCESSING SUBSTRATE

TECHNICAL FIELD

The present invention relates generally to semiconductor manufacturing, and, in particular embodiments, to a method for processing a substrate.

BACKGROUND

Integrated circuits are formed by using planar processes in which an ultraclean, flat wafer of silicon is used as a substrate upon which a large number of identical devices are built by various oxidation, photolithography, removal, ion bombardment and deposition processes. Surface preparation before and after the processes is critical for the patterning of microelectronics devices since device performance, reliability and product yield of silicon circuits are critically affected by the presence of chemical contaminants and particulate impurities on the wafer surface.

A variety of dry and wet processes are currently used for cleaning semiconductor wafer surfaces. Dry cleaning processes include steps for wafer cleaning and wafer drying using a gas exposure. Wet cleaning processes include a series of steps of immersing or spraying the wafers with a variety of liquids, including chemical solutions and rinse solutions. These wet and dry processes may be performed within a wide variety of processing chambers and systems.

Spin chambers are used to clean one or more surfaces of a semiconductor wafer using wet and dry processes. A spin chamber uses a spin chuck and drive mechanism (e.g., a stepper motor) to rotate or spin a semiconductor wafer mounted onto the spin chuck, at least one liquid nozzle for dispensing one or more liquids onto the wafer surface(s) while the semiconductor wafer is spinning, and a large cup for capturing the liquids that are ejected from the wafer surface(s) by the centrifugal forces generated during rotation of the spin chuck.

A variety of cleaning processes may be performed within a spin chamber. In one example cleaning process, a chemical solution is dispensed onto a surface of the semiconductor wafer, while the semiconductor wafer is spinning, to clean the wafer surface. After the cleaning step, a rinse solution is dispensed onto the wafer surface, while the semiconductor wafer is spinning, to remove the chemical solution and rinse the wafer surface. After the rinse step, wafer rotation may continue to spin-dry the wafer surface. In some cases, a puddle process may be performed between the wafer cleaning and rinse steps. In a puddle process, a chemical solution is dispensed onto the wafer surface while wafer rotation is stopped (or significantly slowed) to enable a puddle of the chemical solution to form on the wafer surface. In some cases, the puddle may reduce the amount of chemical needed to clean the wafer surface. Some variations of the puddle process include dispensing a chemical solution onto the wafer and moving the wafer with puddle to a separate chamber for a supercritical dry process, which may be useful for reducing or eliminating pattern collapse on fine features.

Conventional wet cleaning processes and processing chambers have several disadvantages. For example, spin chambers tend to be large and complicated, due to the need for a spin chuck, drive mechanism and large liquid capturing cup. In addition, current wet cleaning processes utilized within spin chambers typically require a large amount of ultrapure chemicals. Pattern collapse may occur due to high surface tension of solvents at supercritical pressures. The high cost and large amount of ultrapure chemicals required in current wet cleaning processes, and the treatment of hazardous waste resulting from such processes, together with its incompatibility with the advanced concepts of integrated processing such as cluster tooling, require new processing chambers and methods that are less affected by these limitations.

There is a strong need for an improved processing system and method to reduce chemical consumption, reduce processing steps, and increase equipment utilization without losing the effectiveness of the process. In particular, there is a need for improved methods for ultraclean surface preparation including wet and dry processes.

SUMMARY

In accordance with an embodiment, a method for processing a substrate includes: providing the substrate into a processing chamber; adding isopropyl alcohol into the processing chamber; adding carbon dioxide to the processing chamber in a liquid phase while draining the isopropyl alcohol from the processing chamber; and releasing the carbon dioxide from the processing chamber in a gaseous phase.

In accordance with another embodiment, a method for processing a substrate includes: providing the substrate into a processing space of a processing chamber; injecting isopropyl alcohol into the processing space; dispensing liquid carbon dioxide into the processing space while removing the isopropyl alcohol from the processing space; maintaining the processing space at a pressure of 5 MPa or less while filling the processing space with the liquid carbon dioxide; and releasing the liquid carbon dioxide from the processing space with a transition of the liquid carbon dioxide to a gaseous phase.

In accordance with yet another embodiment, a method for processing a substrate includes: providing the substrate into a processing chamber; injecting isopropyl alcohol into the processing chamber; draining the isopropyl alcohol from the processing chamber while adding liquid carbon dioxide to the processing chamber; after draining the isopropyl alcohol, bringing the liquid carbon dioxide to a supercritical condition; and after performing a supercritical dry process on the substrate, removing the carbon dioxide from the processing chamber.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

According to one or more embodiments of the present disclosure, this application relates to methods of wet and dry processing of a substrate, such as a semiconductor wafer. Current processing of substrates with supercritical fluid after a cleaning and rinse process (e.g., with a rinsing fluid such as isopropyl alcohol (IPA)) may use carbon dioxide ($CO_2$) for pressurizing the chamber above 7 MPa in order to allow supercritical $CO_2$ to be deposited onto the substrate. However, this may use a large amount of $CO_2$ and lead to waste of the rinsing fluid, which is not recovered. In embodiments of the current disclosure, a processing chamber is filled with a rinsing fluid and then a liquid (e.g., liquid $CO_2$) is dispensed into the processing chamber. While the liquid is being dispensed, the rinsing fluid may be recovered by being drained from the processing chamber. This is advantageous by allowing the rinsing fluid to be reused or recycled. The liquid (e.g., liquid $CO_2$) may have a lower surface tension than the rinsing fluid (e.g., IPA), which may reduce the risk of pattern collapse on the substrate.

Performing the process at a lower pressure (e.g., less than a pressure needed for IPA to be supercritical) and at a lower temperature (e.g., room temperature) may increase throughput. Removing the rinsing fluid (e.g., IPA) without bringing it to a supercritical state may allow the processing chamber to operate at lower pressures, thereby reducing cost.

Embodiments of the disclosure are described in the context of the accompanying drawings. An example of a processing chamber for wet and dry processing of a substrate will be described using FIGS. 1A, 1B, and 1C. Embodiments of methods for cleaning a substrate will be described using FIGS. 2, 3, 4, 5, 6, 7, and 8. Embodiments of methods for processing a substrate will be described using FIGS. 9, 10, and 11.

Figure 1A:
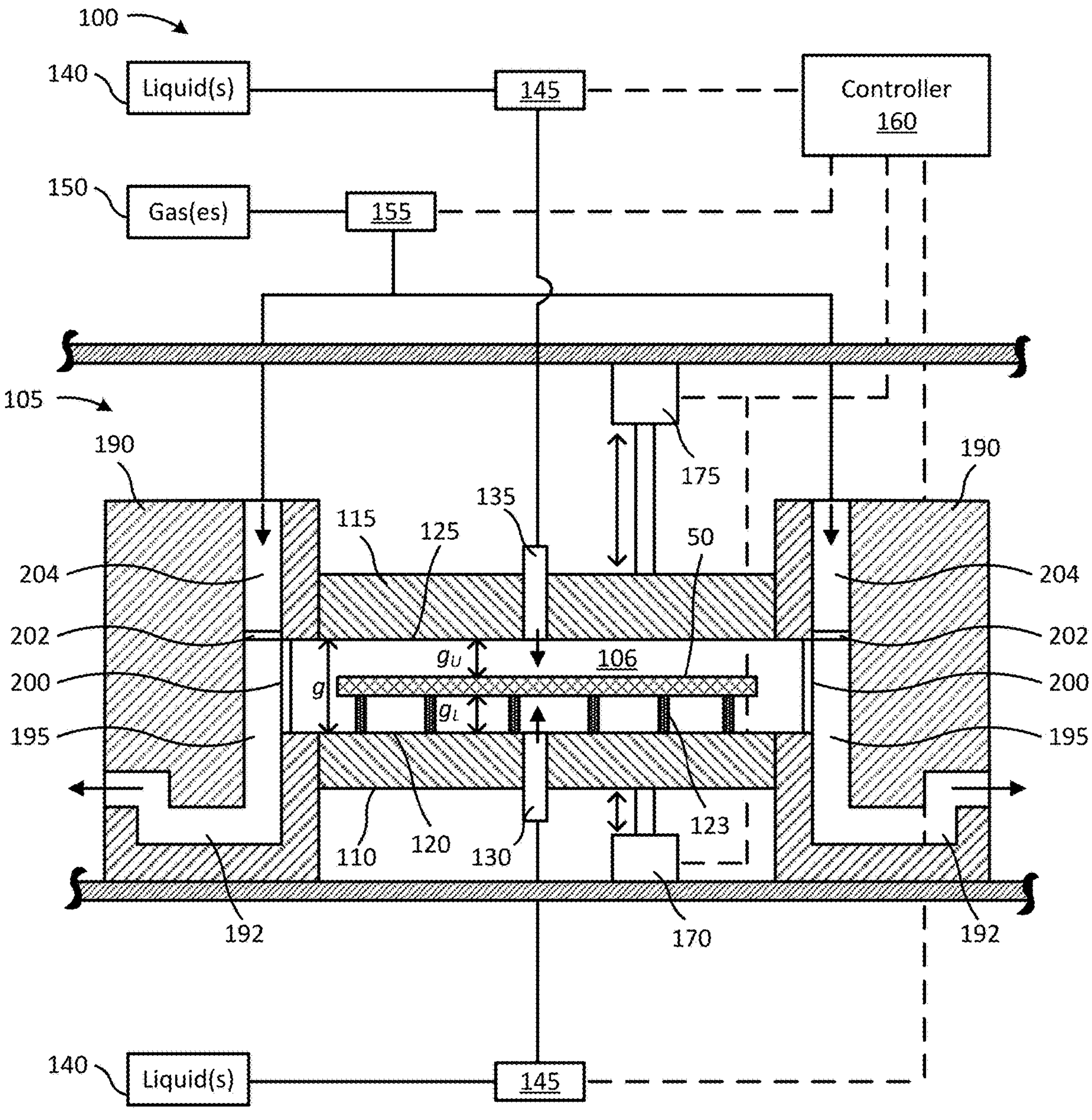
FIG. 1A illustrates an example processing system for processing of a substrate.

FIG. 1A schematically illustrates a cross-sectional view of an example processing system 100 (also referred to as a substrate processing system or a wafer processing system) for processing of a substrate. The processing system 100 illustrated by FIG. 1A includes a processing chamber 105 in which a substrate 50 (e.g., a semiconductor wafer) is processed. The processing chamber 105 includes a bottom plate 110 having portions making up a lower working surface 120 inside the processing chamber 105 and a top plate 115 having portions making up an upper working surface 125 inside the processing chamber 105. A processing space 106 is formed between the upper working surface 125 and the lower working surface 120 of the processing chamber 105. In some embodiments, the processing space 106 has a diameter in a range of 50 mm to 460 mm, such as 300 mm.

Figure 1B:
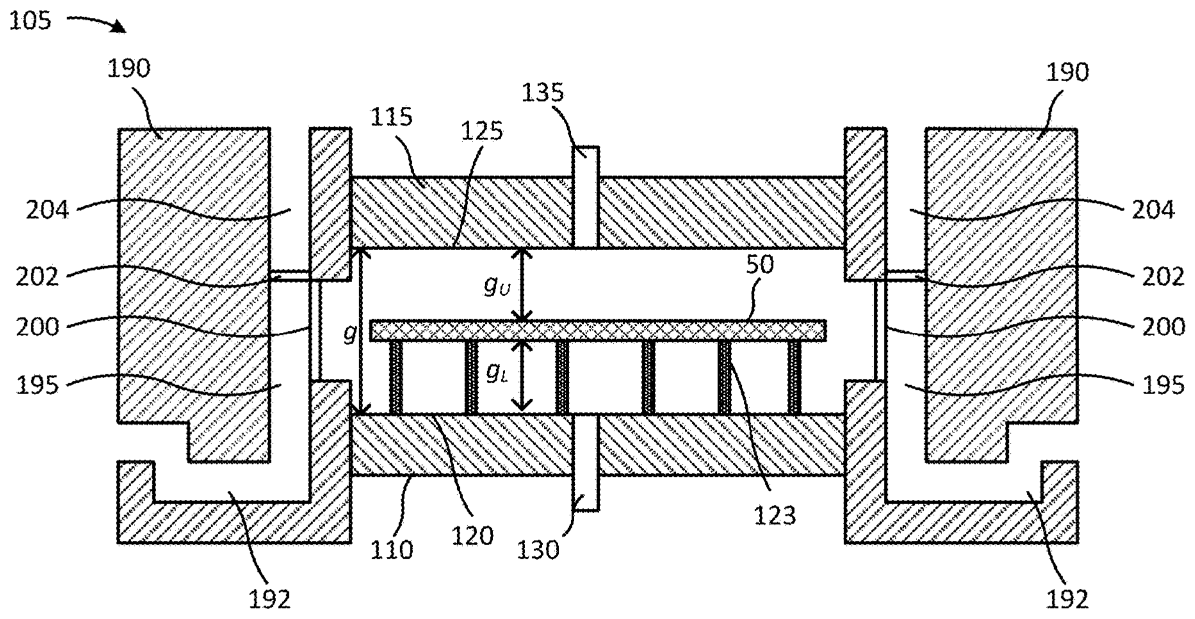
FIG. 1B illustrates an example processing chamber with top and bottom plates adjusted to increase a gap between the top and bottom plates.
Figure 1C:
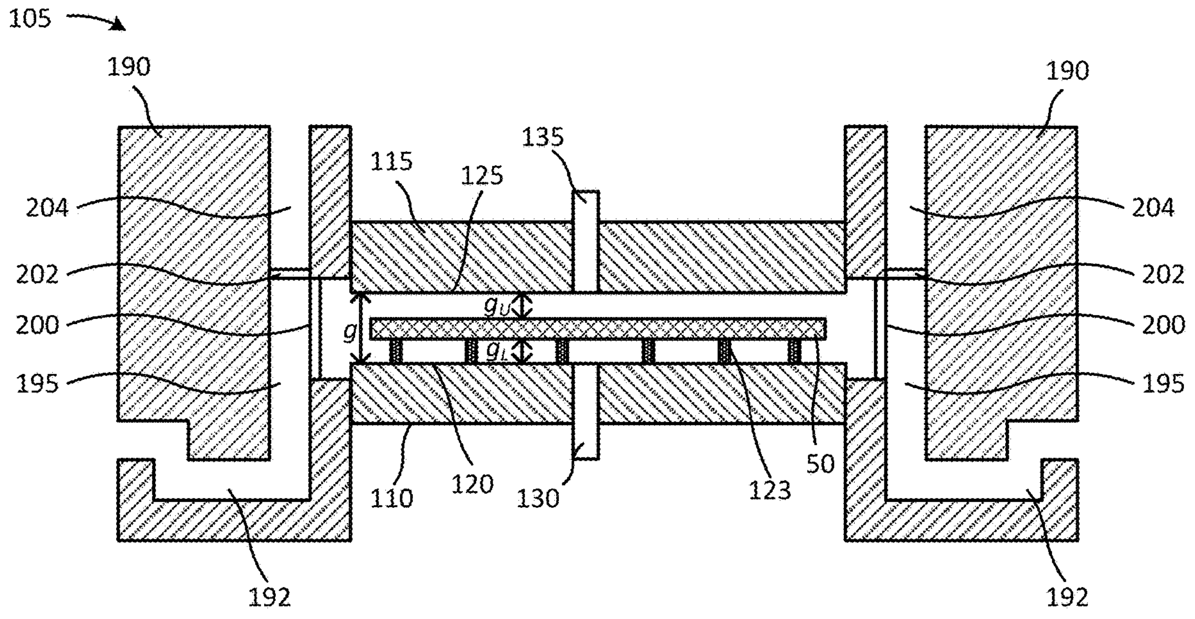
FIG. 1C illustrates an example processing chamber with top and bottom plates adjusted to decrease a gap between the top and bottom plates.

The upper working surface 125 inside the processing chamber 105 is spaced above the lower working surface 120 and separated by a gap (g). FIG. 1B illustrates a cross-sectional view of an optional example of the processing chamber 105 with top plate 115 and bottom plate 110 adjusted to increase the gap g between the top plate 115 and bottom plate 110, and FIG. 1C illustrates a cross-sectional view of an optional example of the processing chamber 105 with top plate 115 and bottom plate 110 adjusted to decrease the gap g between the top plate 115 and bottom plate 110.

The processing chamber 105 further includes one or more structure(s) for supporting the substrate 50 in the processing space 106. In various examples, the one or more structure(s) for supporting the wafer includes a plurality of pins 123 that extend through the bottom plate 110 into the processing space 106 and supports the substrate 50 from the bottom, as shown in FIG. 1A. In one example, the substrate 50 is supported by at least three circumferentially spaced pins 123 projecting from the bottom plate 110 and extending above the lower working surface 120. In other examples, a plurality of pins 123 can support the substrate 50 by contacting the edge of the substrate 50. Although either example may be utilized, a plurality of pins 123 that support the substrate 50 from the bottom may prevent sagging of the substrate 50, and thus, the formation of a non-uniform gap between the upper/lower working surfaces of the processing chamber 105 and the top/bottom surfaces of the wafer.

When a substrate 50 to be processed is inserted and mounted within the processing space 106, an upper gap ($g_U$) is present between the upper working surface 125 of the processing chamber 105 and the top surface of the wafer, and a lower gap ($g_L$) is present between the lower working surface 120 of the processing chamber 105 and the bottom surface of the wafer. It may be desirable that the upper gap ($g_U$) and the lower gap ($g_L$) be substantially equal to maintain a similar distance (or uniform gap) between the upper working surface 125 and the top surface of the substrate 50 and the lower working surface 120 and the bottom surface of the substrate 50. In some examples, the upper gap ($g_U$) and the lower gap ($g_L$) may be in a range between 0.01 mm and 10.0 mm.

In some examples, the upper gap ($g_U$) and the lower gap ($g_L$) can be adjusted before or during a process to increase the gap (g) between the upper working surface 125 and the lower working surface 120, and thus, increase the interior volume of the processing space 106, as shown in FIG. 1B. In other examples, the upper gap ($g_U$) and the lower gap ($g_L$) can be adjusted before or during a process to decrease the gap (g) between the upper working surface 125 and the lower working surface 120, and thus, decrease the interior volume of the processing space 106, as shown in FIG. 1C.

As shown in FIG. 1A, the bottom plate 110 has at least one opening 130 that passes through the lower working surface 120 of the processing chamber 105. When processing a substrate 50 mounted within the processing space 106, the at least one opening 130 passing through the lower working surface 120 may be in fluid flow communication with at least one processing fluid (e.g., a liquid and/or a gas), and may be configured to direct the at least one processing fluid into the processing space 106 above the lower working surface 120 for processing a bottom surface of the substrate 50.

In some examples, the at least one opening 130 passing through the lower working surface 120 includes one or more backside nozzles for dispensing a processing fluid into the processing space 106 above the lower working surface 120. In one example, the at least one opening 130 includes a backside nozzle, which is centered in the bottom plate 110 for dispensing the processing fluid into the processing space 106 near a center of the substrate 50, as shown in FIG. 1A. In some examples, the at least one opening 130 includes one or more auxiliary backside nozzles, which are positioned between the center of the bottom plate 110 and the edge of the substrate 50 for dispensing the processing fluid (or a different processing fluid) onto other areas of the substrate 50. Regardless of the number of backside nozzles utilized, the processing fluid(s) dispensed from the backside nozzle (s) is/are directed onto the bottom surface of the substrate 50 and thereafter flow radially towards the edge of the wafer. According to one substrate 50, the backside nozzle(s) may be coupled to a controller (such as controller 160) configured for selecting a first processing fluid (e.g., a liquid or a gas) that is introduced into the processing space.

The top plate 115 also includes at least one opening 135 that passes through the upper working surface 125 of the processing chamber 105. When processing a substrate 50 mounted within the processing space 106, the at least one opening 135 passing through the upper working surface 125 may be in fluid flow communication with at least one processing fluid (e.g., a liquid and/or a gas), and may be configured to direct the at least one processing fluid into the processing space 106 below the upper working surface 125 for processing a top surface of the substrate 50.

In some examples, the at least one opening 135 passing through the upper working surface 125 includes one or more frontside nozzles for dispensing the processing fluid into the processing space 106 below the upper working surface 125. In one example, the at least one opening 135 includes a frontside nozzle, which is centered in the top plate 115 for dispensing the processing fluid into the processing space 106 near a center of the substrate 50, as shown in FIG. 1A. The at least one opening 135 may include one or more auxiliary frontside nozzles, which are positioned between the center of the top plate 115 and the edge of the wafer for dispensing the processing fluid (or a different processing fluid) onto other areas of the wafer.

Regardless of the number of frontside nozzles utilized, the processing fluid(s) dispensed from the frontside nozzle(s) is/are directed onto the top surface of the substrate 50 and thereafter flow radially towards the edge of the substrate 50. Similar to the backside nozzle(s), the frontside nozzle(s) may be coupled to a controller (such as controller 160) that is configured for selecting a second processing fluid (e.g., a liquid or a gas) that is introduced into the processing space.

Although FIG. 1A illustrates the at least one opening 130 as being through a midline of the bottom plate 110 and the at least one opening 135 as being through a midline of the top plate 115, any suitable number of openings 130 and 135 may be present in any suitable positions through the bottom plate 110, top plate 115, or through the drainage system 190.

In some examples, the processing system 100 shown in FIG. 1A is further configured for supercritical processing to be performed within the processing chamber 105. A first set of valves 200 is provided within the processing chamber 105 between the processing space 106 and the drainage system 190. The first set of valves 200 may be closed to seal processing fluid(s) within the processing space 106 or opened to allow the processing fluid(s) to drain out of the processing space through the conduits 195 contained within the drainage system 190. A second set of valves 202 is provided within the processing chamber 105 between gas inlets 204 and the conduits 195 contained within the drainage system 190. The gas inlets 204 are coupled to one or more sources of a pressurized gas, such as the one or more gases 150 (e.g., nitrogen ($N_2$), carbon dioxide ($CO_2$), IPA vapor, air, or the like) and gas supply valves 155. The second set of valves 202 may be closed when injecting processing fluid(s) into the processing space 106 or opened to allow a gas (such as, e.g., air, nitrogen, carbon dioxide, or the like) injected into the gas inlets 204 to push any remaining processing fluid(s) through the conduits 195 and out of the drainage system 190.

According to one example, the processing system 100 shown in FIG. 1A is configured for wet processing a substrate 50 in the processing space 106. The wet processing can include introducing a first liquid into the processing space through the at least one opening 130 in the lower working surface 120, introducing a second liquid into the processing space through the at least one opening 135 in the upper working surface 125, or both. The first liquid and the second liquid may be the same liquid, or may be different liquids. In one example, the wet processing is a cleaning process where a top surface of the wafer, a bottom surface of the wafer, or both, are cleaned of residues and contaminants.

According to one example, the processing system 100 shown in FIG. 1A may be configured for dry processing a substrate 50 in the processing space 106. The dry processing can include introducing a first gas into the processing space through the at least one opening 130 in the lower working surface 120, introducing a second gas into the processing space through the at least one opening 135 in the upper working surface 125, or both. The first gas and the second gas may be the same gas, or may be different gases. In one example, the dry processing is a drying process where a top surface of the wafer, a bottom surface of the wafer, or both, are dried of liquids.

According to one example, the processing system 100 shown in FIG. 1A may be configured for wet processing, followed by dry processing, of a substrate 50 in the processing space 106. In one example, the wet processing may be a cleaning process where a top surface of the wafer, a bottom surface of the wafer, or both, are cleaned of residues and contaminants by injecting one or more liquids onto the wafer surface(s). The dry processing may be a drying process where a top surface of the wafer, a bottom surface of the wafer, or both, are dried by injecting one or more gases onto the wafer surface(s) to remove a liquid from the wafer surface(s).

According to one example, the substrate 50 is not rotated during wet or dry processing. According to another example, the processing system 100 comprises means for rotating the wafer (not shown) and the wafer is rotated during wet processing, dry processing or both wet and dry processing.

In some examples, the at least one opening 130 passing through the upper working surface 125 of the processing chamber 105 and the at least one opening 135 passing through the lower working surface 120 of the processing chamber 105 are in fluid flow communication with supply lines for one or more liquids 140 and liquid supply valves 145, as shown further in FIG. 1A. In other examples, the at least one opening 130 passing through the upper working surface 125 of the processing chamber 105 and the at least one opening 135 passing through the lower working surface 120 of the processing chamber 105 are also in fluid flow communication with supply lines for one or more gases 150 and gas supply valves 155.

In some examples, the processing system 100 includes a controller 160 that is coupled to the liquid supply valves 145 and gas supply valves 155 for selectively providing the one or more liquids 140 and/or the one or more gases 150 to the processing space 106 defined within the processing chamber 105. A wide variety of liquids and gases may be selectively provided to the processing space 106 depending on the process, or process step, being performed within the processing chamber 105.

During a cleaning process, for example, the controller 160 may supply control signals to the liquid and gas supply valves 145/155 to selectively provide a cleaning solution and/or a rinse solution to the processing space 106 for cleaning and/or rinsing at least one surface of the substrate 50. Examples of cleaning solutions include, but are not limited to, an ammonia/peroxide mixture (APM), a hydrochloric/peroxide mixture (HPM) and a sulfuric peroxide mixture (SPM). Examples of rinse solutions include, but are not limited to, deionized (DI) water and isopropyl alcohol (IPA). Other cleaning solutions and rinse solutions may also be utilized. After cleaning and/or rinsing the surface(s) of the substrate 50, the controller 160 may supply control signals to the liquid and gas supply valves 145/155 to selectively provide a gas (such as, but not limited to, air, nitrogen, carbon dioxide, or the like) to the processing space 106 to remove any remaining liquid the wafer surface(s), thereby drying the wafer surface(s). The gas may be vented to outside the processing chamber through the openings 130, 135, or any other suitable opening or vent that couples the processing space 106 to the outside of the processing chamber 105.

In some examples, the controller 160 supplies control signals to the liquid and gas supply valves 145/155 to selectively provide a low surface tension liquid (such as IPA) to the processing space 106, before the cleaning step is performed, to pre-wet the wafer surface, as well as the upper working surface 125 and the lower working surface 120 of the processing chamber 105.

In some optional examples, the controller 160 (or another controller included within the processing system 100) may be configured to adjust a vertical position of the top plate 115, a vertical position of the bottom plate 110 and/or the gap (g) between the top and bottom plates. In the example shown in FIG. 1A, controller 160 is coupled to supply control signals to an optional lifting mechanism 170 coupled to the bottom plate 110 and an optional lifting mechanism 175 coupled to the top plate 115. The placement and configuration of the lifting mechanisms 170/175 is exemplary and provided herein merely for explanatory purposes.

The control signals supplied from the controller 160 to the lifting mechanisms 170/175 can be used to adjust a vertical position of the top plate 115 and/or a vertical position of the bottom plate 110. In some examples, for example, the controller 160 may supply a control signal to the lifting mechanism 175 to raise the top plate 115, so that a substrate 50 may be inserted with the processing space 106, as illustrated for example in FIG. 2. In other examples, the controller 160 may supply control signals to the lifting mechanisms 170/175 to adjust the upper gap ($g_U$) between the upper working surface 125 of the processing chamber 105 and the top surface of the substrate 50 and/or to adjust the lower gap ($g_L$) between the lower working surface 120 of the processing chamber 105 and the bottom surface of the substrate 50, as shown for example in FIGS. 1B and 1C. It is recognized that the controller 160 and the lifting mechanisms 170/175 represent only one means for adjusting the vertical position of the top plate 115, the vertical position of the bottom plate 110, and/or the gap (g) between the top and bottom plates. Other means for adjustment may also be used.

The upper gap ($g_U$) and the lower gap ($g_L$) can be adjusted for a wide variety of purposes. In some examples, the upper gap ($g_U$) and the lower gap ($g_L$) can be decreased, as shown in FIG. 1C, to decrease the interior volume of the processing space 106, increase the fluid velocity of the processing fluid(s) spreading radially across the wafer surface(s) and/or decrease the amount of processing fluid(s) needed to perform a particular process or process step. On the other hand, the upper gap ($g_U$) and the lower gap ($g_L$) can be increased, as shown in FIG. 1B, to increase the interior volume of the processing space 106, decrease the fluid velocity of the processing fluid(s) spreading radially across the wafer surface(s) and/or increase the amount of processing fluid(s) needed to perform a particular process or process step. In some examples, the upper gap ($g_U$) and the lower gap ($g_L$) can be adjusted together, or independently, for different processes (e.g., different cleaning processes), or different steps (e.g., cleaning and rinse steps) within the same process.

In some examples, additional feature(s) may be added to the top plate 115 and/or the bottom plate 110 of the processing chamber 105. For example, a sonic transducer may be added to the top plate 115 and/or the bottom plate 110 to enhance the wet (e.g., cleaning) process. The sonic transducer can be embedded within the entire top/bottom plate, or within only a portion of the top/bottom plate. In another example, the top plate 115 and/or the bottom plate 110 include one or more heating element(s) to control the temperature of the substrate 50 and heat the liquid/gas dispensed onto the surface of the substrate 50. The one or more heating element(s) may be used, such as in conjunction with pressurized gas through the gas inlets 204 and valves 202 or other suitable valves and inlets, to bring a fluid (e.g., liquid carbon dioxide) within the processing space 106 to a supercritical state. Alternatively, an additional nozzle may be embedded within the top plate 115 and/or the bottom plate 110 to inject steam into the processing space to heat the liquid/gas dispensed onto the wafer surface. In yet another example, the top plate 115 and/or the bottom plate 110 may include one or more sensors used to inspect the wafer and/or the liquids dispensed onto the wafer surface(s). For example, a conductive meter may be added to the top/bottom plate to monitor the liquids dispensed onto the wafer surface.

The processing system 100 illustrated by FIG. 1A further includes a drainage system 190 for directing processing fluids out of the processing chamber 105. According to one example, drainage system 190 contains a conduit 195 that is in fluid communication with, and downstream from, the processing space 106. The conduit 195 includes a first portion 192, which is coupled to the processing space 106 and positioned below the lower working surface 120 of the processing chamber 105. According to one example, the first portion 192 of the conduit 195 is implemented with a U-shape, as shown in FIG. 1A. A bottom of the U-shaped conduit is positioned below the lower working surface 120 of the processing chamber 105.

The processing system 100 and processing chamber 105 illustrated by FIGS. 1A, 1B, and 1C is included as a non-limiting example for illustrative purposes. Further examples of suitable processing chambers for embodiments of the current disclosure may be found in U.S. patent application Ser. No. 18/192,279, which is hereby incorporated by reference in its entirety.

Figure 2:
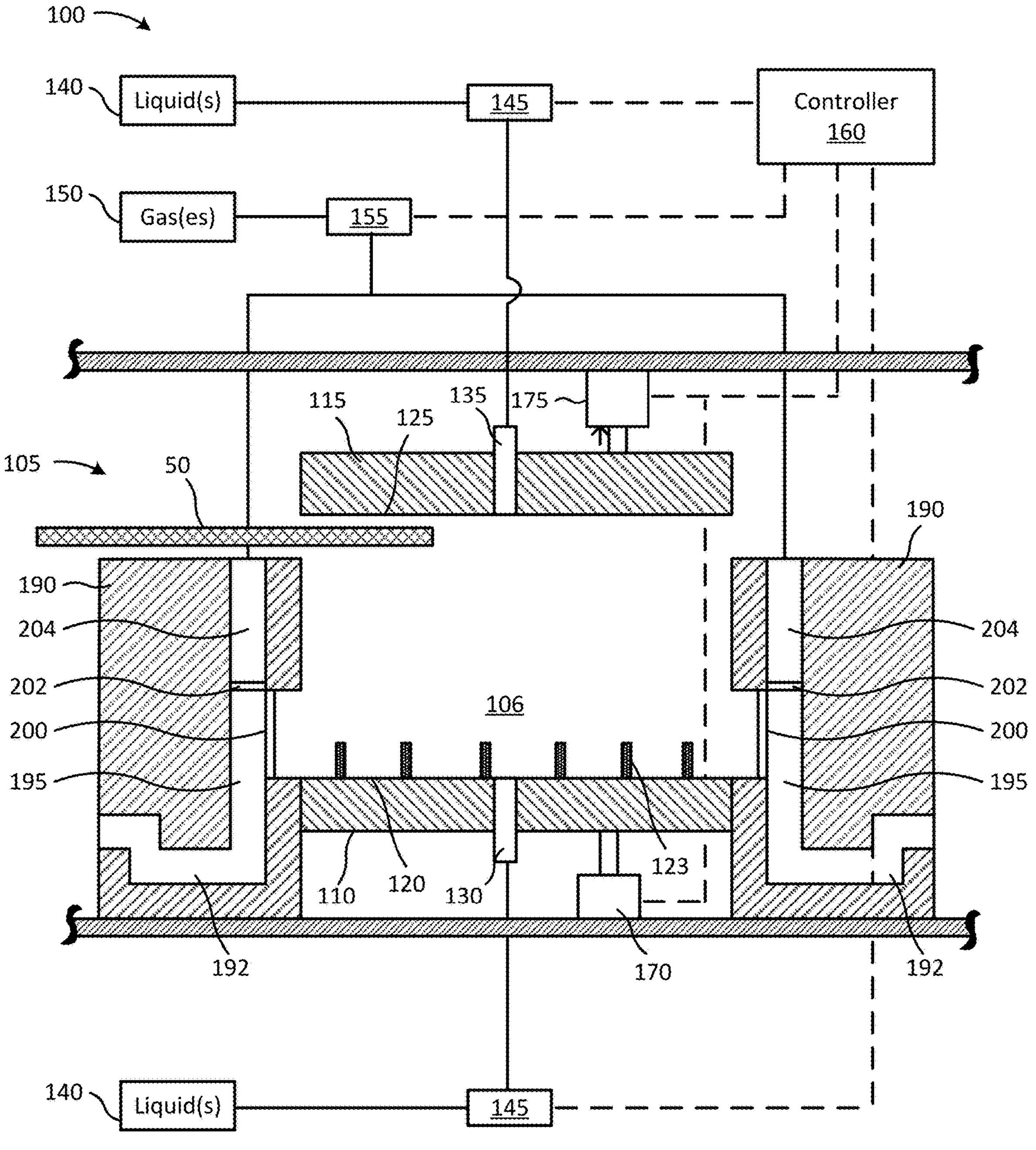
FIGS. 2-8 illustrate cross-sectional views of a processing system during intermediate stages of a method for cleaning a substrate, in accordance with some embodiments.
Figure 3:
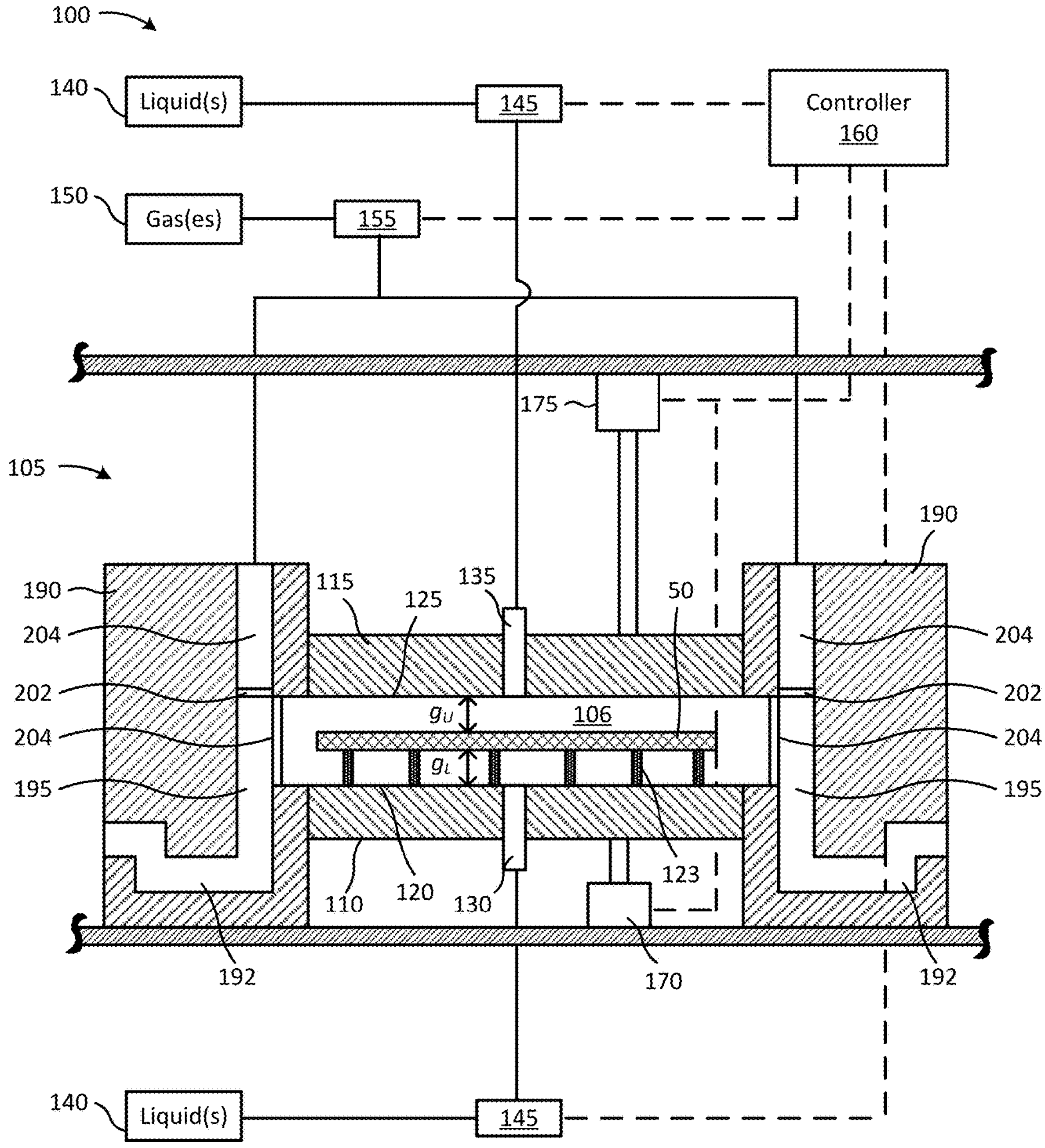

FIGS. 2 through 8 illustrate cross-sectional views of a processing system (e.g., the example processing system 100) during intermediate stages of methods for cleaning a substrate, in accordance with some embodiments. FIGS. 2 and 3 illustrate a substrate 50 being inserted within a processing space 106 and supported substantially parallel to the upper and lower working surfaces of the enclosed processing chamber 105.

As illustrated in FIG. 2, a control signal is supplied to the lifting mechanism 175 to raise the top plate 115, enabling the substrate 50 to be inserted into the processing space 106 formed between the bottom plate 110 and the top plate 115 of the processing chamber 105. Once inserted, the substrate 50 is supported substantially parallel to the upper working surface 125 and the lower working surface 120 of the processing chamber 105. However, the substrate 50 may be inserted into the processing space 106 by any suitable process.

Next, in FIG. 3, the substrate 50 is supported on a plurality of pins 123, which extend from the lower working surface 120 of the enclosed processing chamber 105 to support the substrate 50 from the bottom of the substrate 50. In other embodiments, the substrate 50 may be supported by a plurality of pins 123 that support the substrate 50 by contacting the edge of the substrate 50.

After the substrate 50 is inserted within the processing space 106 and mounted on the plurality of pins 123, a control signal may be supplied to the lifting mechanism 175 to lower the top plate 115 and enclose the processing chamber 105. In some embodiments, additional control signals may be supplied to the lifting mechanisms 170/175 to adjust the upper gap ($g_U$) between the upper working surface 125 of the processing chamber 105 and the top surface of the wafer and the lower gap ($g_L$) between the lower working surface 120 of the processing chamber 105 and the bottom surface of the wafer.

Figure 4:
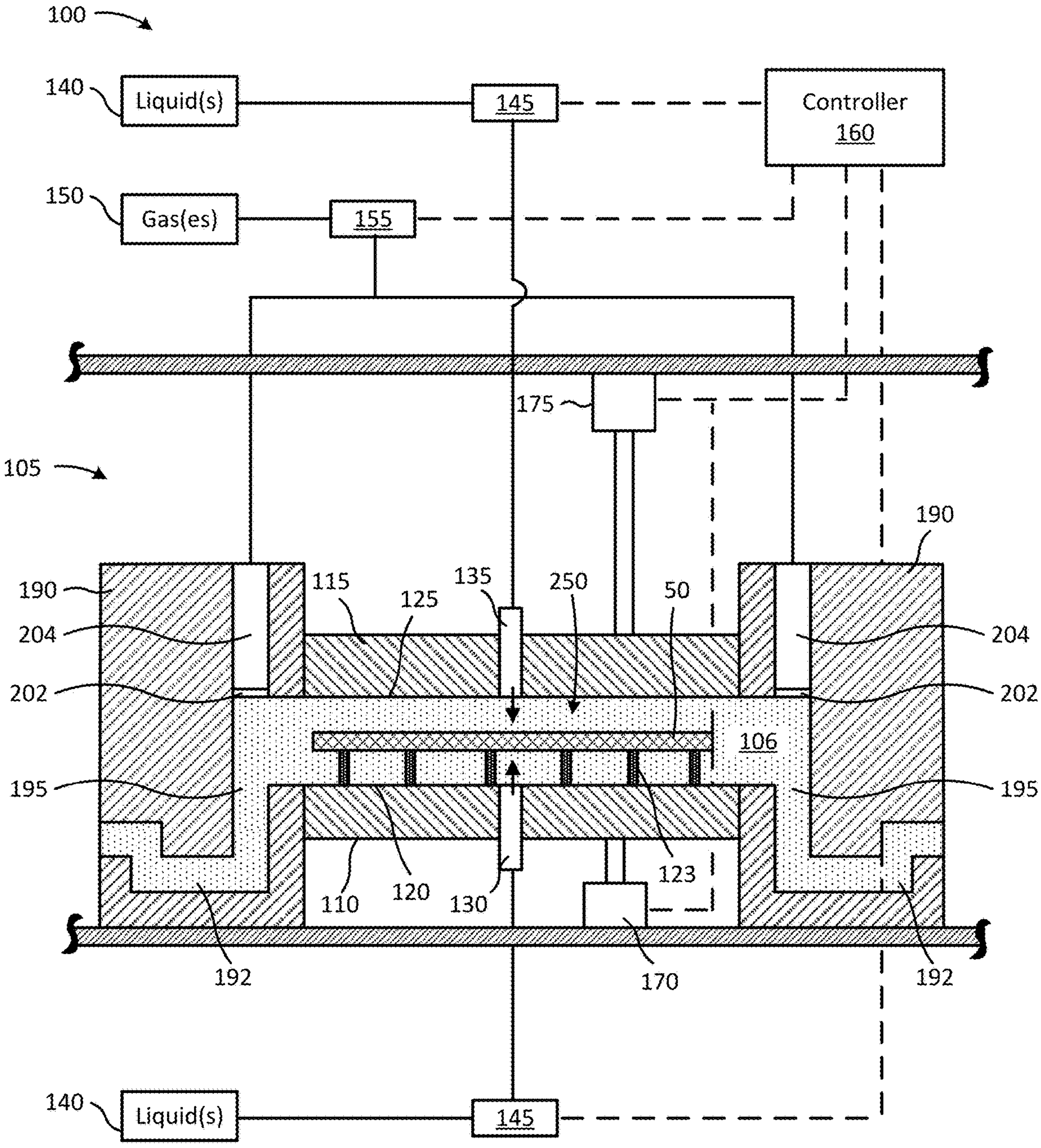

In FIG. 4, following from FIG. 3, a processing fluid 250 (also referred to as a rinsing fluid) is injected into the processing space 106 through at least one opening 130/135 in either the top plate, the bottom plate, or both the top plate and the bottom plate of the enclosed processing chamber 105. In various embodiments, the processing fluid 250 is a cleaning solution and/or a rinse solution used for cleaning and/or rinsing at least one surface of the substrate 50, such as a low surface tension fluid (e.g., isopropyl alcohol (IPA).

Figure 5:
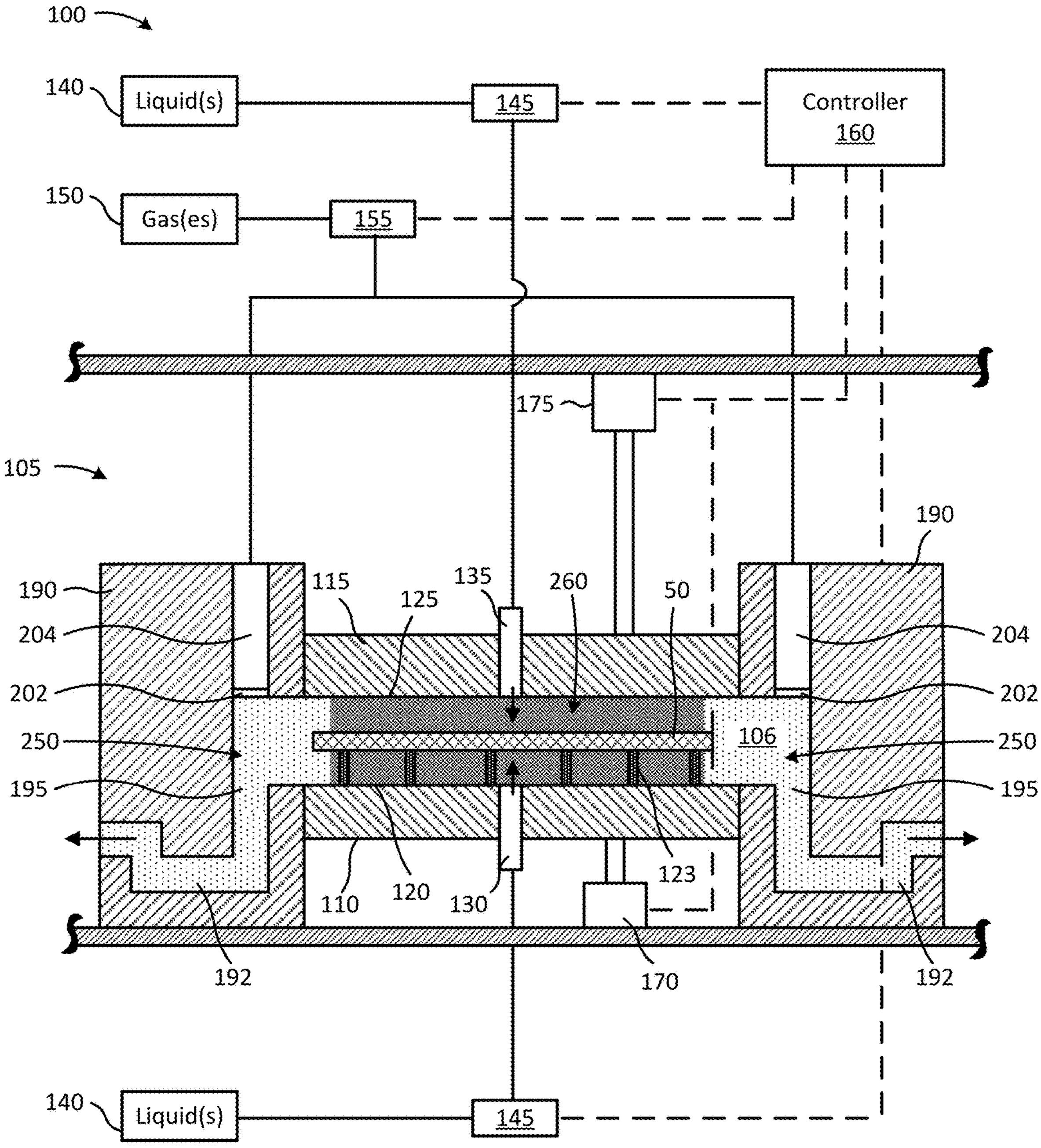

Next, in FIG. 5, a fluid 260 (also referred to as a dry fluid) is dispensed into the processing space 106. In various embodiments, the fluid 260 is a cryogenic liquid for a dry process such as liquid carbon dioxide ($CO_2$), the like, or a combination thereof. The fluid 260 may be injected into the processing chamber 105 through, for example, the at least one openings 130/135. However, the fluid 260 may be injected into the processing chamber 105 through any suitable inlets. The fluid 260 (e.g., liquid $CO_2$) may have a lower surface tension than the processing fluid 250 (e.g., IPA), which may reduce the risk of pattern collapse on the substrate.

Injecting the fluid 260 at a lower pressure (e.g., less than a pressure needed for the processing fluid 250, such as IPA, to be supercritical) and at a lower temperature (e.g., room temperature) may be advantageous by increasing throughput. Removing the processing fluid 250 (e.g., IPA) without bringing it to a supercritical state may allow the processing chamber 105 to operate at lower pressures, thereby reducing cost. For example, liquid $CO_2$ at room temperature (e.g., around 25° C.) needs to be at a pressure above 4.5 MPa, while IPA does not reach a supercritical state until 235.6° C. at 5.37 MPa. By inserting the fluid 260 without bringing it to a supercritical state, the pressure in the processing chamber 105 may be kept at 5 MPa or less, such as in a range of 4.5 MPa to 5 MPa, while adding the fluid 260 and recovering the processing fluid 250, thereby allowing the processing chamber 105 to have a lower tolerance for high pressures. As tolerances may be, for example, three times the desired pressure, the processing chamber 105 could have a tolerance of 15 MPa, which could reduce costs.

While the fluid 260 is injected into the processing chamber 105, the processing fluid 250 may be drained from the processing chamber 105, such as through the conduits 195 of the drainage system 190. The processing fluid 250 may be recovered and reused. This is advantageous for recycling the processing fluid 250 and thereby saving costs. Removing the rinsing fluid (e.g., IPA) without bringing it to a supercritical state (also referred to as a supercritical condition) may allow the processing chamber to operate at lower pressures, thereby reducing cost.

Figure 6:
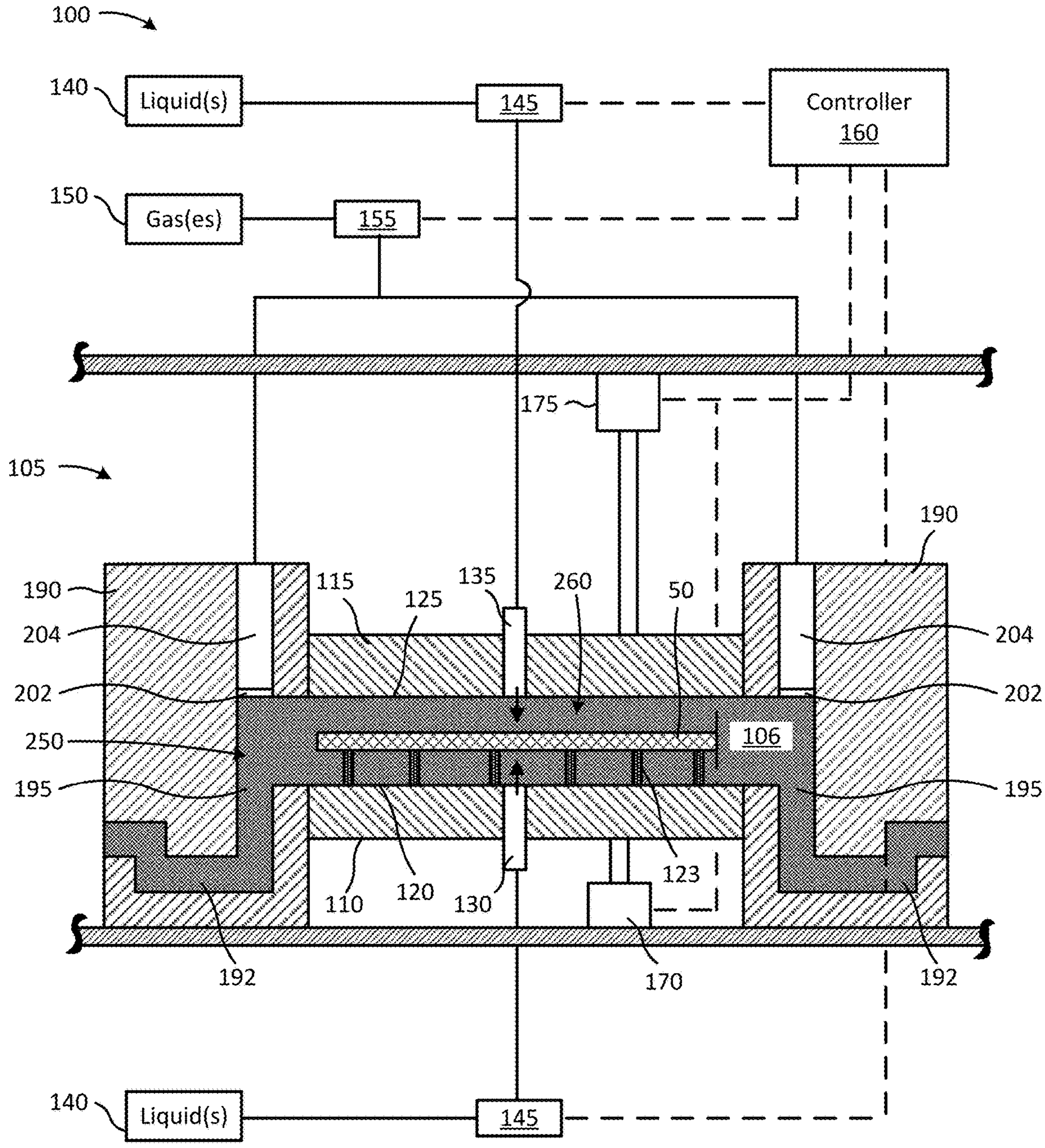

In FIG. 6, following from FIG. 5, the fluid 260 fills the processing space 106 of the processing chamber 105 after the processing fluid 250 has been removed. The fluid 260 may have a lower surface tension than the processing fluid 250 (e.g., IPA), which may reduce the risk of pattern collapse on the substrate 50. For example, liquid $CO_2$ has a surface tension of 1.37 mN/m at 20° C. and 0.59 mN/m at 25° C. Additionally, introducing the fluid 260 in a liquid phase (rather than, e.g., in a supercritical condition) may allow less of the fluid 260 to be used, thereby saving costs.

In some embodiments, the fluid 260 is brought to a supercritical condition, such as by increasing the temperature and pressure in the processing space 106. For example, liquid $CO_2$ may be brought to supercriticality by increasing the temperature to 30.98° C. or above and increasing the pressure to 7.38 MPa or above. Using a supercritical fluid to treat the substrate 50 may be advantageous to improve substrate drying and avoiding pattern collapse that sometimes occurs when using a processing fluid (e.g., IPA) to dry substrate surfaces. Since supercritical fluids have zero surface tension, pattern collapse may not occur when the wafer is dried in a supercritical fluid environment. Bringing the fluid 260 to supercriticality in the processing chamber 105 allows for a full processing of the substrate 50 (e.g., a treatment such as a rinse with the processing fluid 250) and a subsequent supercritical fluid dry treatment in the same processing chamber. The supercritical dry process may allow for uniform clearing of the processing chamber 105 after processing.

The processing chamber 105 may be pressurized with gas through the gas inlets 204 and valves 202 and have temperature increased by one or more heating element(s) of the top plate 115 and/or the bottom plate 110, as described above with respect to FIG. 1A. However, any suitable methods or mechanisms may be used to adjust the temperature and pressure in the processing chamber 105 to bring the fluid 260 to a supercritical condition.

Figure 7:
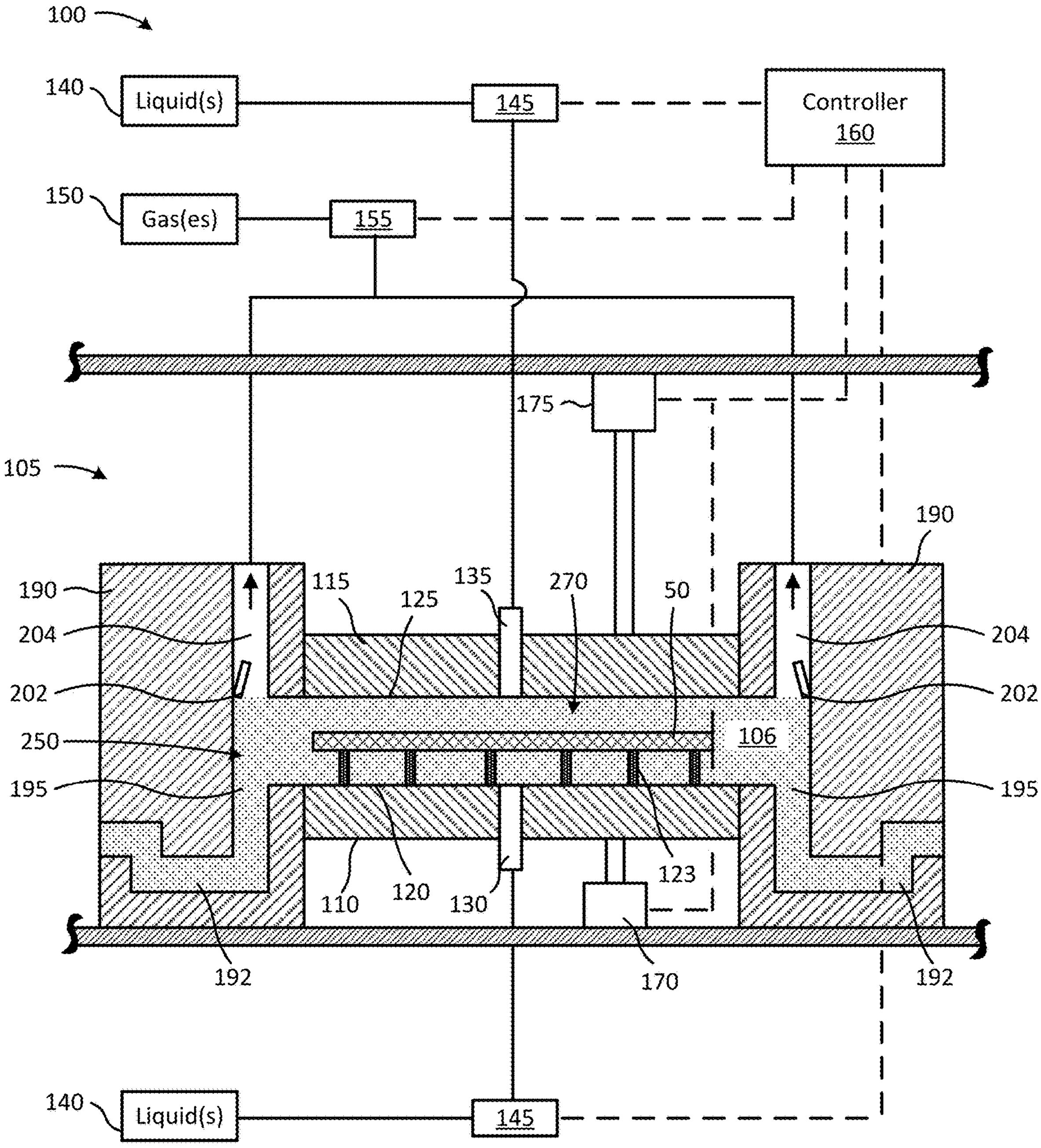

Next, in FIG. 7, the processing chamber 105 is depressurized and the fluid 260 is vented out (in other words, released from the processing chamber) in a gaseous phase. In other words, the fluid 260 (e.g., liquid $CO_2$) undergoes a phase transition to a gas 270 (e.g., gaseous $CO_2$). The gas 270 is then vented outside of the processing chamber 105, such as through the open valves 202. However, any valves and/or gas outlets may be used to vent the gas 270 out of the processing chamber 105, such as the one or more openings 130/135.

Figure 8:
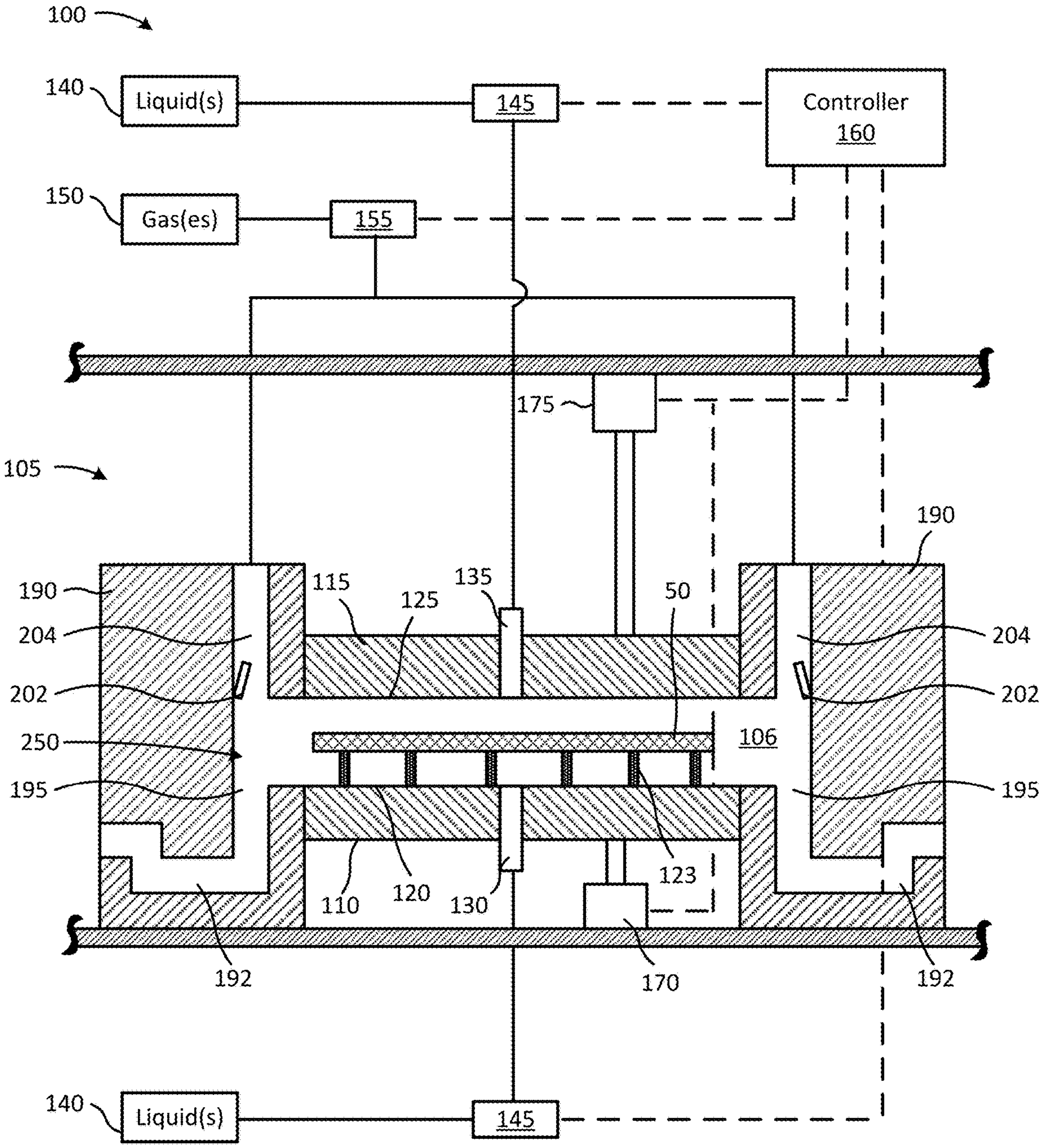

In FIG. 8, following from FIG. 7, the gas 270 has exited the processing chamber 105 and the process on the substrate 50 is complete. In some embodiments, the substrate 50 is then be removed from the processing chamber 105. In other embodiments, additional liquids and/or gases may be injected into the processing chamber 105 in order to perform additional wet and/or dry processes on the substrate 50.

Figure 9:
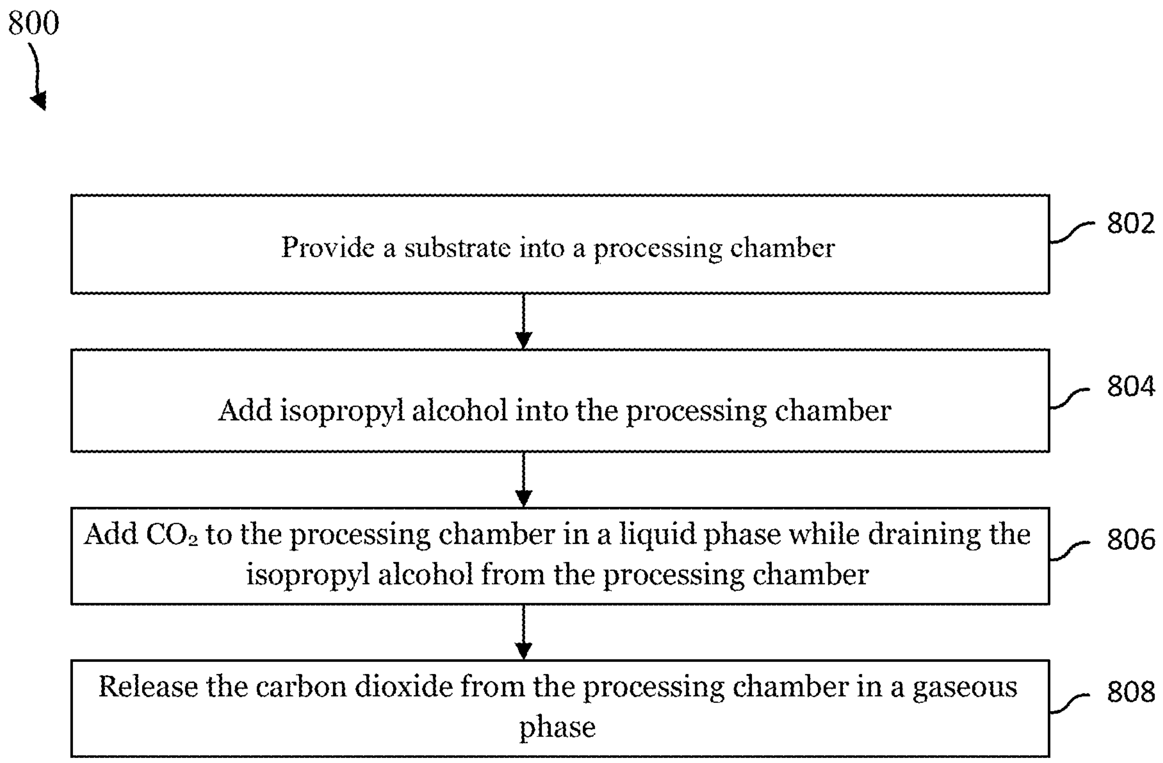
FIG. 9 illustrates a process flow chart diagram of a method for processing a substrate, in accordance with some embodiments.

FIG. 9 illustrates a process flow chart diagram of a method 800 for processing a substrate, in accordance with some embodiments. In step 802, the substrate is provided into a processing chamber, as described above with respect to FIGS. 2 and 3. In step 804, isopropyl alcohol is added into the processing chamber, as described above with respect to FIG. 4. In step 806, carbon dioxide is added to the processing chamber in a liquid phase while draining the isopropyl alcohol from the processing chamber, as described above with respect to FIGS. 5 and 6. In step 808, the carbon dioxide is released from the processing chamber in a gaseous phase, as described above with respect to FIG. 7.

Figure 10:
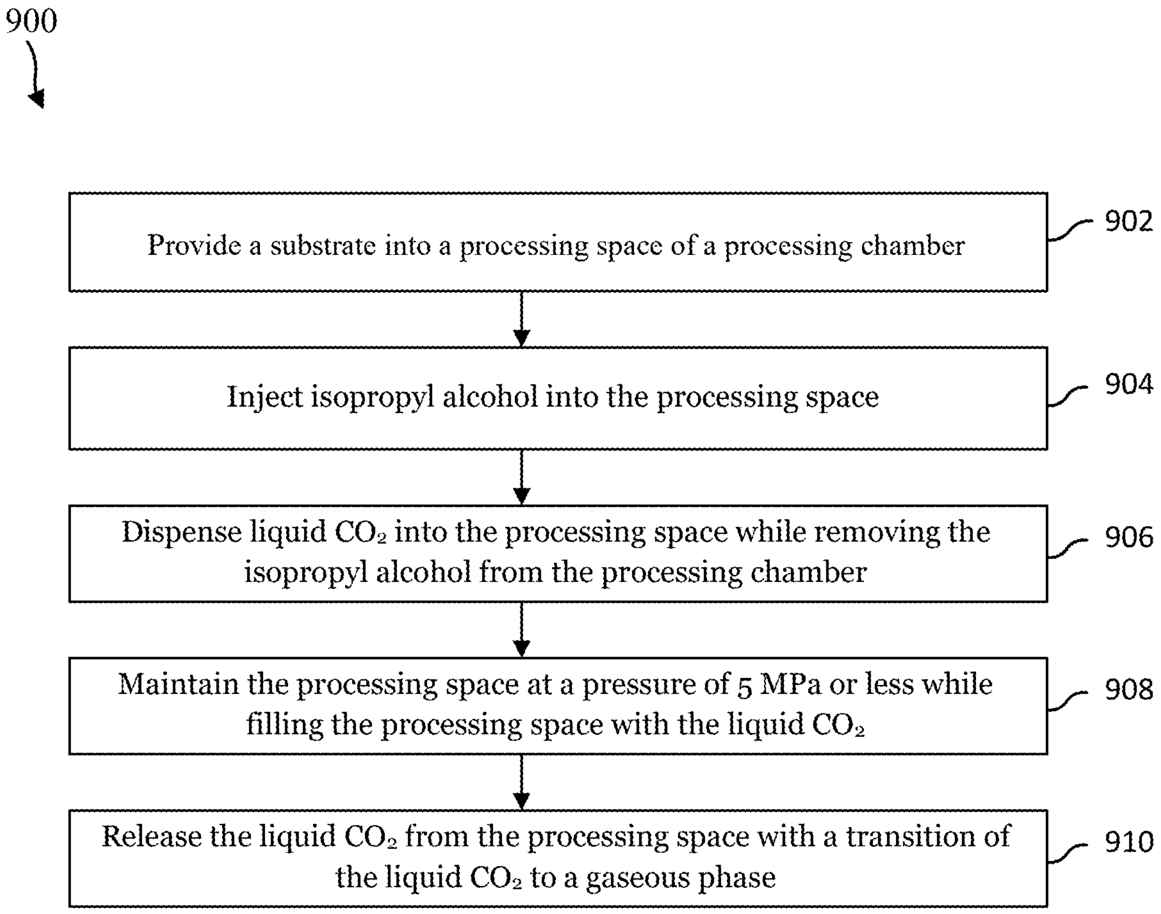
FIG. 10 illustrates a process flow chart diagram of a method for processing a substrate, in accordance with some embodiments.

FIG. 10 illustrates a process flow chart diagram of a method 900 for processing a substrate, in accordance with some embodiments. In step 902, the substrate is provided into a processing space of a processing chamber, as described above with respect to FIGS. 2 and 3. In step 904, isopropyl alcohol is injected into the processing space, as described above with respect to FIG. 4. In step 906, liquid carbon dioxide is dispensed into the processing space while removing the isopropyl alcohol from the processing space, as described above with respect to FIGS. 5 and 6. In step 908, the processing space is maintained at a pressure of 5 MPa or less while filling the processing space with the liquid carbon dioxide, as described above with respect to FIG. 5. In step 910, the liquid carbon dioxide is released from the processing space with a transition of the liquid carbon dioxide to a gaseous phase, as described above with respect to FIG. 7.

Figure 11:
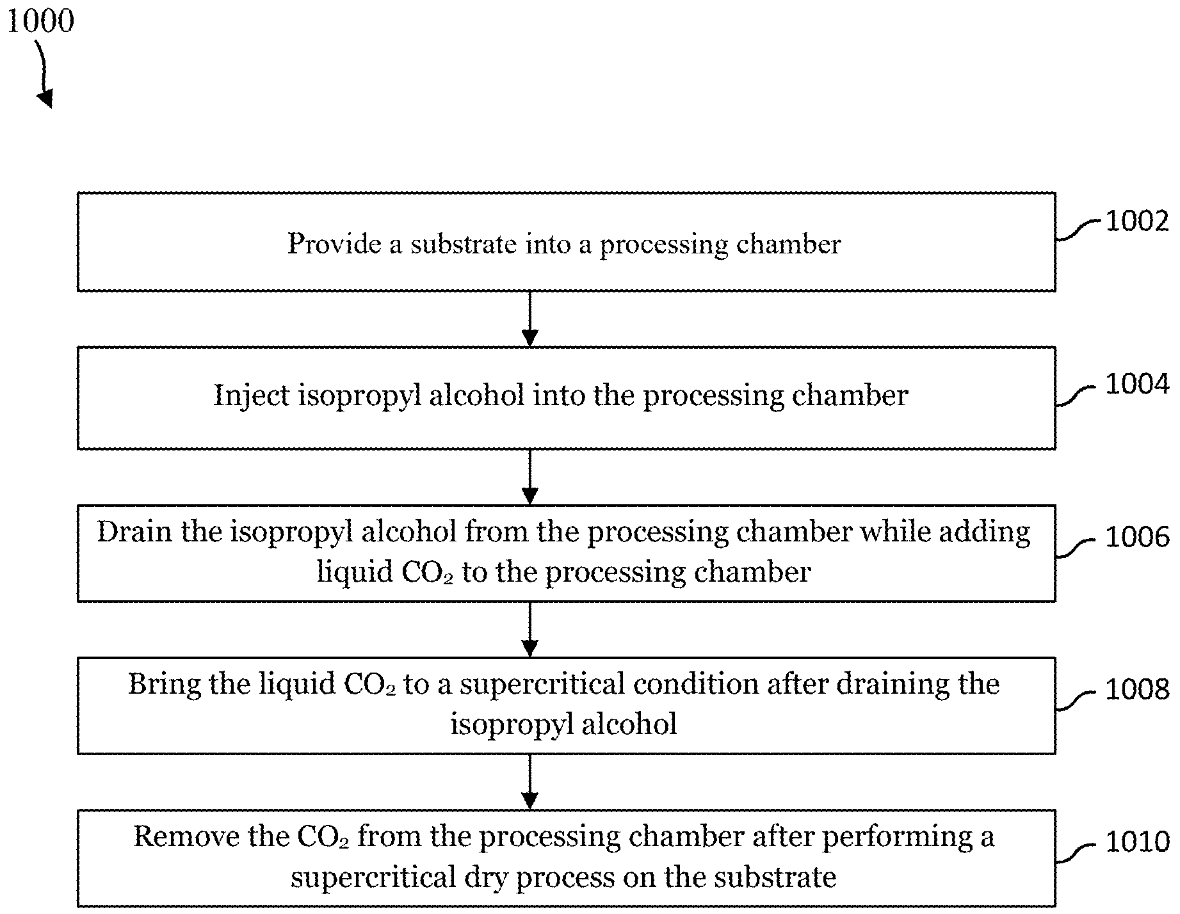
FIG. 11 illustrates a process flow chart diagram of a method for processing a substrate, in accordance with some embodiments.

FIG. 11 illustrates a process flow chart diagram of a method 1000 for processing a substrate, in accordance with some embodiments. In step 1002, the substrate is provided into a processing chamber. In step 1004, isopropyl alcohol is injected into the processing chamber, as described above with respect to FIG. 4. In step 1006, the isopropyl alcohol is drained from the processing chamber while adding liquid carbon dioxide to the processing chamber, as described above with respect to FIGS. 5 and 6. In step 1008, after draining the isopropyl alcohol, the liquid carbon dioxide is brought to a supercritical condition, as described above with respect to FIG. 6. In step 1010, after performing a supercritical dry process on the substrate, the carbon dioxide from the processing chamber, as described above with respect to FIG. 7.

Example embodiments of the disclosure are summarized here. Other embodiments can also be understood from the entirety of the specification as well as the claims filed herein.

Example 1. A method for processing a substrate, the method including: providing the substrate into a processing chamber; adding isopropyl alcohol into the processing chamber; adding carbon dioxide to the processing chamber in a liquid phase while draining the isopropyl alcohol from the processing chamber; and releasing the carbon dioxide from the processing chamber in a gaseous phase.

Example 2. The method of example 1, where draining the isopropyl alcohol from the processing chamber includes recovering the isopropyl alcohol for recycling.

Example 3. The method of one of examples 1 or 2, where releasing the carbon dioxide from the processing chamber includes depressurizing the processing chamber.

Example 4. The method of one of examples 1 to 3, where releasing the carbon dioxide from the processing chamber further includes venting the carbon dioxide in the gaseous phase.

Example 5. The method of one of examples 1 to 4, where the carbon dioxide is added to the processing chamber in the liquid phase under a pressure in a range of 4.5 MPa to 5 MPa.

Example 6. The method of one of examples 1 to 5, further including bringing the carbon dioxide to a supercritical condition in the processing chamber.

Example 7. The method of example 6, where bringing the carbon dioxide to a supercritical condition in the processing chamber includes increasing the pressure in the processing chamber to 7.38 MPa or above.

Example 8. The method of one of examples 6 or 7, where bringing the carbon dioxide to a supercritical condition in the processing chamber includes increasing the temperature in the processing chamber to 30.98° C. or above.

Example 9. A method for processing a substrate, the method including: providing the substrate into a processing space of a processing chamber; injecting isopropyl alcohol into the processing space; dispensing liquid carbon dioxide into the processing space while removing the isopropyl alcohol from the processing space; maintaining the processing space at a pressure of 5 MPa or less while filling the processing space with the liquid carbon dioxide; and releasing the liquid carbon dioxide from the processing space with a transition of the liquid carbon dioxide to a gaseous phase.

Example 10. The method of example 9, where the processing space is maintained at a pressure in a range of 4.5 MPa to 5 MPa while filling the processing space with the liquid carbon dioxide.

Example 11. The method of one of examples 9 or 10, further including recovering the isopropyl alcohol for recycling after removing the isopropyl alcohol from the processing space.

Example 12. The method of one of examples 9 to 11, where releasing the liquid carbon dioxide from the processing chamber further includes depressurizing the processing chamber.

Example 13. The method of one of examples 9 to 12, where releasing the liquid carbon dioxide from the processing chamber further includes venting gaseous carbon dioxide.

Example 14. A method for processing a substrate, the method including: providing the substrate into a processing chamber; injecting isopropyl alcohol into the processing chamber; draining the isopropyl alcohol from the processing chamber while adding liquid carbon dioxide to the processing chamber; after draining the isopropyl alcohol, bringing the liquid carbon dioxide to a supercritical condition; and after performing a supercritical dry process on the substrate, removing the carbon dioxide from the processing chamber.

Example 15. The method of example 14, where bringing the carbon dioxide to a supercritical condition in the processing chamber includes increasing the pressure in the processing chamber to 7.38 MPa or above.

Example 16. The method of one of examples 14 or 15, where bringing the carbon dioxide to a supercritical condition in the processing chamber includes increasing the temperature in the processing chamber to 30.98° C. or above.

Example 17. The method of one of examples 14 to 16, where draining the isopropyl alcohol further includes recovering the isopropyl alcohol for recycling.

Example 18. The method of one of examples 14 to 17, further including maintaining the processing chamber at a pressure of 5 MPa or less while adding the liquid carbon dioxide into the processing chamber.

Example 19. The method of one of examples 14 to 18, where removing the carbon dioxide from the processing chamber includes depressurizing the processing chamber.

Example 20. The method of one of examples 14 to 19, where removing the carbon dioxide from the processing chamber includes venting gaseous carbon dioxide.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for processing a substrate, the method comprising:

providing the substrate into a processing chamber;

adding isopropyl alcohol into the processing chamber;

performing a drying process on the substrate by adding carbon dioxide to the processing chamber in a liquid phase while draining the isopropyl alcohol from the processing chamber, the carbon dioxide not being brought to a supercritical condition while or after draining the isopropyl alcohol; and releasing the carbon dioxide from the processing chamber in a gaseous phase.

2. The method of claim 1, wherein draining the isopropyl alcohol from the processing chamber comprises recovering the isopropyl alcohol for recycling.

3. The method of claim 1, wherein releasing the carbon dioxide from the processing chamber comprises depressurizing the processing chamber.

4. The method of claim 1, wherein releasing the carbon dioxide from the processing chamber further comprises venting the carbon dioxide in the gaseous phase.

5. The method of claim 1, wherein the carbon dioxide is added to the processing chamber in the liquid phase under a pressure in a range of 4.5 MPa to 5 MPa.

6. The method of claim 1, wherein performing the drying process is performed at a temperature of about 25° C.

7. The method of claim 1, wherein adding isopropyl alcohol into the processing chamber fills the processing chamber.

8. The method of claim 1, wherein the processing chamber has a tolerance of 15 MPa.

9. A method for processing a substrate, the method comprising:

providing the substrate into a processing space of a processing chamber;

injecting isopropyl alcohol into the processing space;

dispensing liquid carbon dioxide into the processing space while removing the isopropyl alcohol from the processing space;

maintaining the processing space at a pressure of 5 MPa or less while filling the processing space with the liquid carbon dioxide;

performing a drying process on the substrate with the liquid carbon dioxide without bringing the liquid carbon dioxide to a supercritical state; and releasing the liquid carbon dioxide from the processing space with a transition of the liquid carbon dioxide to a gaseous phase.

10. The method of claim 9, wherein the processing space is maintained at a pressure in a range of 4.5 MPa to 5 MPa while filling the processing space with the liquid carbon dioxide.

11. The method of claim 9, further comprising recovering the isopropyl alcohol for recycling after removing the isopropyl alcohol from the processing space.

12. The method of claim 9, wherein releasing the liquid carbon dioxide from the processing space further comprises depressurizing the processing chamber.

13. The method of claim 9, wherein releasing the liquid carbon dioxide from the processing space further comprises venting gaseous carbon dioxide.

14. A method for processing a substrate, the method comprising:

providing the substrate into a processing chamber;

injecting isopropyl alcohol into the processing chamber;

draining the isopropyl alcohol from the processing chamber while adding liquid carbon dioxide to the processing chamber;

after draining the isopropyl alcohol, keeping the liquid carbon dioxide from achieving a supercritical condition; and after performing a non-supercritical dry process on the substrate, removing the carbon dioxide from the processing chamber.

15. The method of claim 14, wherein draining the isopropyl alcohol further comprises recovering the isopropyl alcohol for recycling.

16. The method of claim 14, further comprising maintaining the processing chamber at a pressure of 5 MPa or less while adding the liquid carbon dioxide into the processing chamber.

17. The method of claim 14, wherein removing the carbon dioxide from the processing chamber comprises depressurizing the processing chamber.

18. The method of claim 14, wherein removing the carbon dioxide from the processing chamber comprises venting gaseous carbon dioxide.

19. The method of claim 14, wherein adding liquid carbon dioxide to the processing chamber is performed at room temperature.

20. The method of claim 14, wherein the processing chamber has a tolerance of 15 MPa.

* * * * *